United States Patent
Seo

(10) Patent No.: US 6,727,157 B2
(45) Date of Patent: Apr. 27, 2004

(54) METHOD FOR FORMING A SHALLOW TRENCH ISOLATION USING AIR GAP

(75) Inventor: Young Hun Seo, Bucheon-si (KR)

(73) Assignee: Anam Semiconductor, Inc., Seoul (KR)

( * ) Notice: Subject to any disclaimer, the term of this patent is extended or adjusted under 35 U.S.C. 154(b) by 0 days.

(21) Appl. No.: 10/657,082

(22) Filed: Sep. 9, 2003

(65) Prior Publication Data

US 2004/0048444 A1 Mar. 11, 2004

(30) Foreign Application Priority Data

Sep. 9, 2002 (KR) .................. 10-2002-0054202

(51) Int. Cl.⁷ ................... H01L 21/8242; H01L 21/331; H01L 21/20; H01L 21/76; H01L 21/425
(52) U.S. Cl. .................. 438/421; 438/245; 438/246; 438/360; 438/361; 438/388; 438/389; 438/407; 438/409; 438/411; 438/423; 438/429; 438/430; 438/431; 438/432; 438/524
(58) Field of Search .................. 438/245, 246, 438/360, 361, 388, 389, 407, 409, 411, 421, 423, 424, 429, 430, 431, 432, 524

(56) References Cited

U.S. PATENT DOCUMENTS

| | | | |
|---|---|---|---|
| 5,098,856 A | * | 3/1992 | Beyer et al. ................. 438/422 |
| 6,406,975 B1 | * | 6/2002 | Lim et al. ................... 438/421 |
| 6,576,558 B1 | * | 6/2003 | Lin et al. .................... 438/700 |

* cited by examiner

Primary Examiner—John F. Niebling
Assistant Examiner—Stanetta Isaac
(74) Attorney, Agent, or Firm—Pillsbury Winthrop LLP

(57) ABSTRACT

In fabricating a shallow trench isolation (STI), a silicon oxide layer, a silicon nitride layer and a moat pattern is sequentially deposited on a silicon substrate. Next, the silicon nitride layer and the silicon oxide layer is etched using the moat pattern as a mask to thereby partially expose the silicon substrate and then the moat pattern is removed. Ion implanting process is performed into the silicon substrate using the silicon nitride layer as a mask, adjusting a dose of an implanted ion and an implant energy, to thereby form an isolation region. And then, the isolation region to form a porous silicon and to form an air gap in the porous silicon is anodized, wherein a porosity of the porous silicon is determined by the dose of the implanted ion. Next, the porous silicon is oxidized through an oxidation process. Finally, the silicon nitride layer is removed.

8 Claims, 4 Drawing Sheets

METHOD FOR FORMING A SHALLOW TRENCH ISOLATION USING AIR GAP

FIELD OF THE INVENTION

The present invention relates to a method for fabricating a semiconductor device; and, in particular, to a method for forming a shallow trench isolation (STI) which involves simplified processing steps while ensuring improved isolation through the use of an air gap.

DESCRIPTION OF THE PRIOR ART

Generally, semiconductor devices are fabricated through isolating active regions from field regions at a semiconductor substrate, and forming numerous devices such as transistors at the isolated active regions on the substrate.

In order to perform the device isolation, a shallow trench isolation STI technique has been widely used in the semiconductor device fabrication process. In the STI technique, shallow trenches are made at the semiconductor substrate, and filled with an insulating material. In this way, the field regions can be limited to the relatively narrow trench formation area while making it possible to miniaturize the device dimension as much as possible.

In a conventional STI process, in order to fabricate an STI having uniform width and depth, a variety of etch recipes have been widely used to minimize a leakage current.

FIGS. 1A to 1E sequentially illustrate the steps of fabricating the conventional STI.

Referring to FIG. 1A, a pad oxide layer 102 and a silicon nitride layer 104 are sequentially deposited. Next, a moat pattern 106 is formed on the silicon nitride layer 104.

In FIG. 1B, the silicon nitride layer 104, the pad oxide layer 102 and the silicon substrate 100 are sequentially etched through a photolithography technique using the moat pattern 106 as a mask to thereby form a STI region. At this case, the pad oxide layer 102 and the silicon nitride layer 104 is etched by controlling an etching selectivity and by monitoring an end point thereof using an end point detection system. The silicon substrate 100 is etched during a predetermined time. And then, the moat pattern 106 is stripped away.

Thereafter, the STI region is filled up with a $SiO_2$ to thereby form an insulation layer 108 as shown in FIG. 1C.

As shown in FIG. 1D, the isolation layer 108 is then planarized through a chemical mechanical polishing (CMP) process. The CMP process is performed until a contact resistance of the silicon nitride layer 104 reaches a predetermined value.

Finally, the silicon nitride 104 is removed to thereby complete the STI process.

The conventional STI process is performed through only varying etching recipe in order to obtain a uniform STI depth.

However, as integration in semiconductor integrated circuits is higher, minimum feature size of the integrated circuits, often referred to as critical dimension (CD), is decreasing so that the STI space is also decreasing. For example, if CD of 0.18 um decreases to 0.15 um or 0.13 um, the STI space of 0.24 um is reduced to 0.21 um or 0.18 um. At this case, even if the etching recipe is varied in order to improve the uniformity of the STI depth, there are several limitations such as a reduction of a process margin, sophisticated polymer formation and the like.

Further, as shown in FIG. 1D, the CMP process has to be used in order to remove the overdeposited $SiO_2$ of the isolation layer 108 after the STI formation in the conventional STI process. When the isolation layer 108 is planarized through the CMP process, it is not easy to uniformly planarize because of fine STI space. In other words, difference of the STI space causes a generation of partially overpolished region to produce a step which affects a gate profile in a gate formation process.

Further, this CMP process also can make an overall STI fabricating process complex.

Therefore, there is a need to form STI having an uniform STI depth in a variety of STI space and simplify the overall STI fabricating process.

SUMMARY OF THE INVENTION

It is, therefore, an object of the present invention to provide a STI having an uniform STI depth in a variety of STI space and simplifying the overall STI fabricating process.

In accordance with the present invention, there is provided A method for fabricating a shallow trench isolation, comprising the steps of: sequentially depositing a silicon oxide layer, a silicon nitride layer and a moat pattern on a silicon substrate; etching the silicon nitride layer and the silicon oxide layer using the moat pattern as a mask to thereby partially expose the silicon substrate and then removing the moat pattern; performing ion implanting process into the silicon substrate using the silicon nitride layer as a mask, adjusting a dose of an implanted ion and an implant energy, to thereby form an isolation region; anodizing the isolation region to form a porous silicon and to form an air gap in the porous silicon, wherein a porosity of the porous silicon is determined by the dose of the implanted ion; oxidizing the porous silicon through an oxidation process; and removing the silicon nitride layer.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Preferred embodiments of the present invention will now be described with reference to the accompanying drawings.

The present invention discloses a shallow trench isolation (STI) including porous silicon which is formed by anodic oxidation of ion-implanted silicon substrate 200 using a silicon nitride layer 204 as a mask. The porosity of the porous silicon is dependant on the implanted ion concentration. As a result of using the STI process including the porous silicon, the STI is not affected by a loading effect caused by a reduction of the STI space. In other words, the STI having a uniform depth can be formed regardless of the reduction of the STI space. Also, a surface of the porous silicon, i.e., an upper portion in which is weakly doped is converted to an oxidized poly silicon layer 208 through an oxidation process and a region under the surface of the porous silicon, i.e., lower portion in which is heavily doped is converted to an air gap layer 210 which is substantially free from silicon. Therefore, since the porosity is controlled by the implanted ion concentration to remove the silicon, a chemical mechanical polishing CMP process can be removed to thereby simplify the overall STI fabricating process in the STI process in accordance with the present invention.

FIGS. 2A to 2E sequentially depict the steps of fabricating an shallow trench isolation (STI) using air gap characteristics in accordance with a preferred embodiment of the present invention.

Figure 1A:
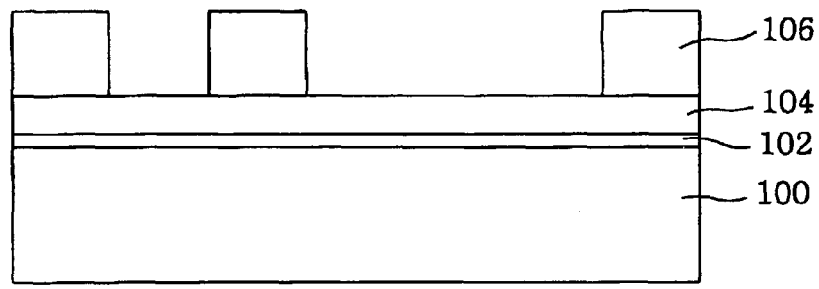
FIGS. 1A to 1E sequentially illustrate the steps of fabricating the STI according to the conventional method.
Figure 1B:
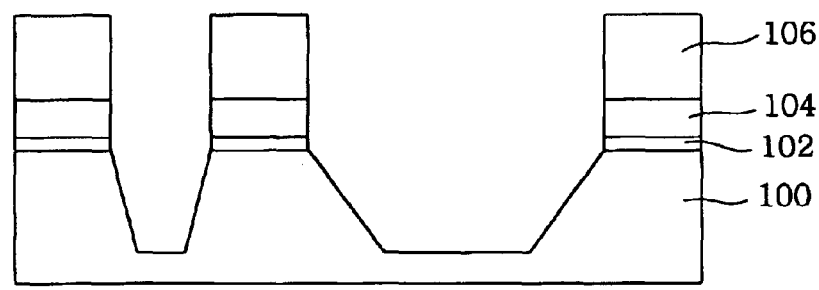
Figure 1C:
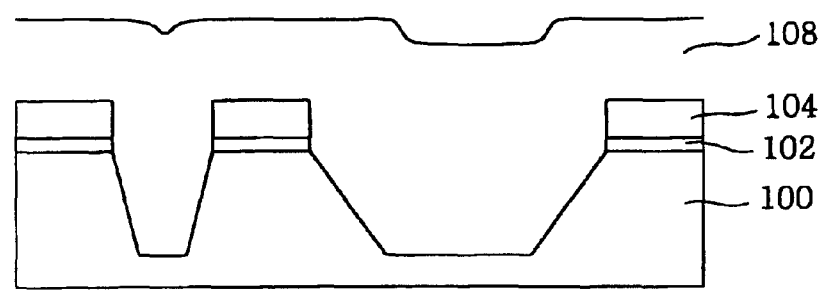
Figure 1D:
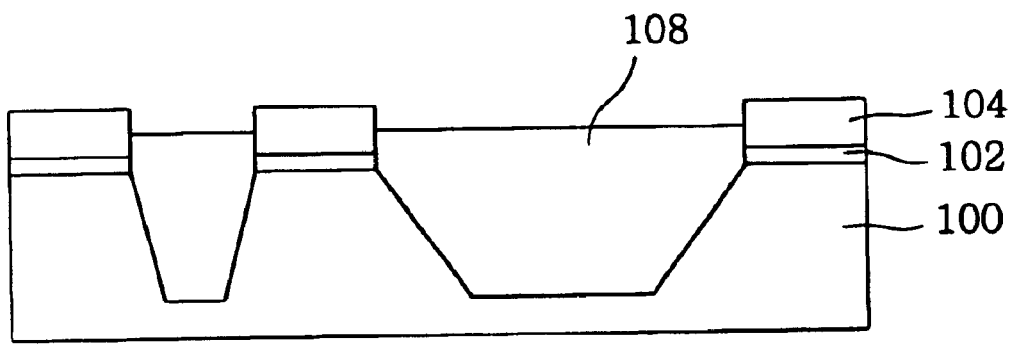
Figure 1E:
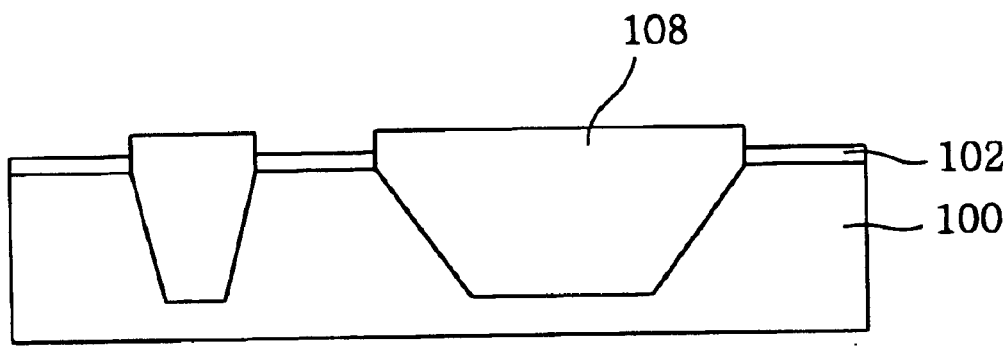
Figure 2A:
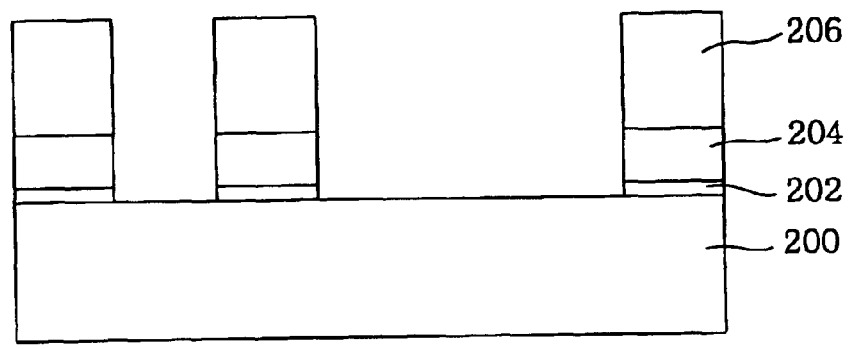
FIGS. 2A to 2E sequentially depict the steps of fabricating the STI in accordance with a preferred embodiment of the present invention.

Referring now to FIG. 2A, a pad oxide layer 202 and a silicon nitride layer 204 is sequentially deposited on the silicon substrate 200. Next, a moat pattern 206 is formed on the silicon nitride layer 204. The silicon nitride layer 204 and the pad oxide layer 202 are sequentially etched using the moat pattern 106 as a mask by controlling etching selectivity and by monitoring an end point thereof using an end point detection system. As a result, the silicon substrate 200 is partially exposed along the pattern. At this case, the silicon nitride layer 204 may be etched with a slope, if necessary, or an additional sidewall nitride layer process may be inserted into the STI process so that a space smaller than the moat pattern can be formed. And then, the moat pattern 206 is removed.

Figure 2B:
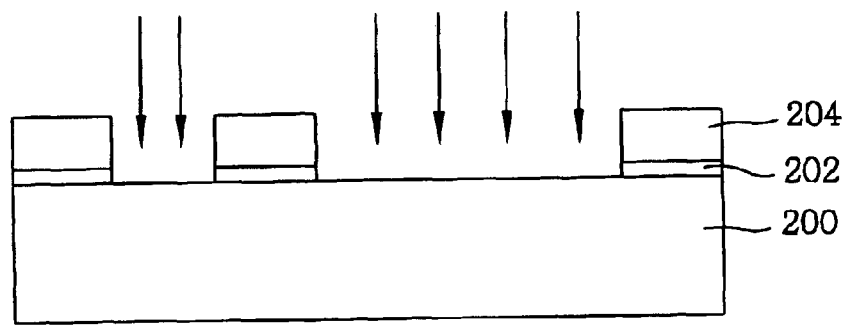

FIG. 2B illustrates an ion implant process using the silicon nitride layer 204 as a mask in accordance with the preferred embodiment of the present invention.

In this preferred embodiment, a dose of an implanted ion and an implant energy in the ion implant process is adjusted to thereby form an isolation region having a stepwise ion concentration downwardly from a surface of the silicon substrate 200. For example, the implanted isolation region may be stepwisely doped in such a manner that an upper portion thereof is weakly doped and a lower portion thereof is heavily doped.

Also, in a following anodic oxidation process, porosity can be controlled according to the dose of the ion implanted into the silicon substrate.

Further, the ion implant process having different ion implant conditions, e.g., different dose of ion implant or different implant energy, is iteratively performed to form the isolation region having the stepwise ion concentration.

In the ion implant process, N-type or P-type material is implanted in the isolation region.

Figure 2C:
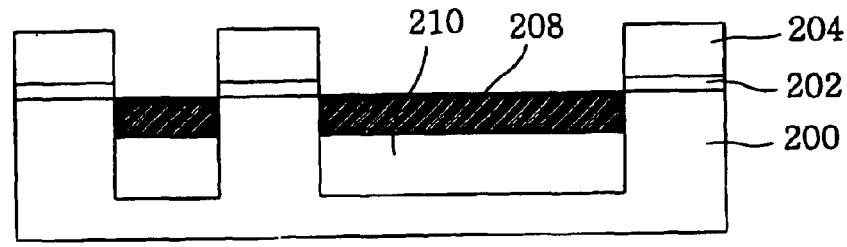

Referring to FIG. 2C, an anodic oxidation on the exposed silicon substrate 200 is performed in a solution of hydrofluoric acid (HF) using the silicon nitride layer 204 as a mask to form a porous silicon 208.

At this case, the weakly doped upper portion of the implant isolation region is converted to the porous silicon 208 having constant pores but the heavily doped lower portion thereof is converted to the air gap 210. In other words, the silicon in the heavily doped lower portion can be removed.

The porosity and the thickness of the porous silicon can be controlled by controlling a reaction time, a current density or HF concentration in the anodic oxidation process.

Figure 2D:
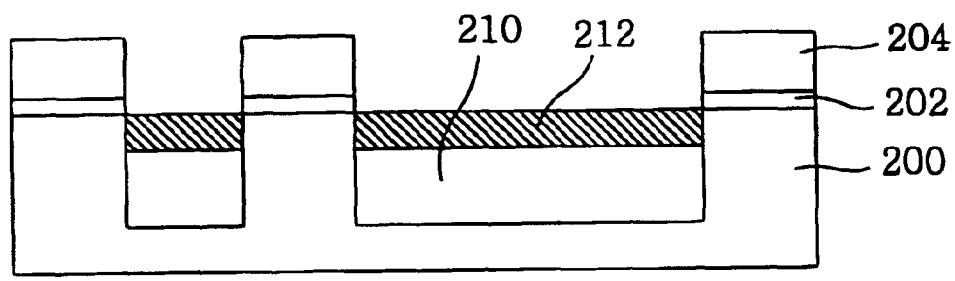

As seen in FIG. 2D, oxidation of the porous silicon 208 is performed to thereby form an oxidized porous silicon 212.

Figure 2E:
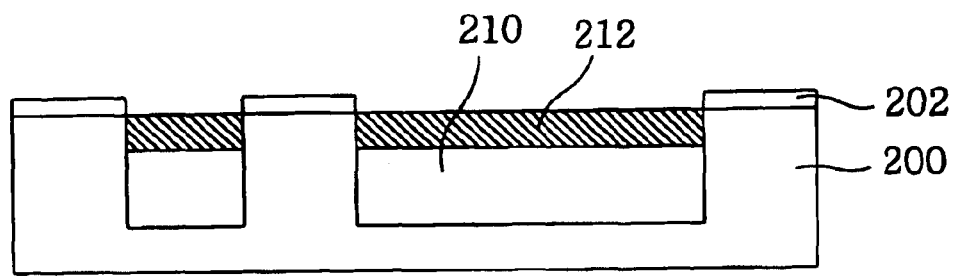

Finally, the silicon nitride 204 is removed to thereby complete the STI process as shown in FIG. 2E.

As shown in the above, in accordance with the present invention, the ununiformity of STI depth which may be caused by the reduction of the semiconductor device size is settled to thereby reduce the leakage current and improve the device yield. Furthermore, the STI process in accordance with the present invention does not use the CMP process to thereby simplify the overall STI fabricating process and obtain the uniform gate profile.

While the invention has been shown and described with respect to the preferred embodiments, it will be understood by those skilled in the art that various changes and modifications may be made without departing from the spirit and scope of the invention as defined in the following claims.

What is claimed is:

1. A method for fabricating a shallow trench isolation, comprising the steps of:

sequentially depositing a silicon oxide layer, a silicon nitride layer and a moat pattern on a silicon substrate;

etching the silicon nitride layer and the silicon oxide layer using the moat pattern as a mask to thereby partially expose the silicon substrate and then removing the moat pattern;

performing ion implanting process into the silicon substrate using the silicon nitride layer as a mask, adjusting a dose of an implanted ion and an implant energy, to thereby form an isolation region;

anodizing the isolation region to form a porous silicon and to form an air gap in the porous silicon, wherein a porosity of the porous silicon is determined by the dose of the implanted ion;

oxidizing the porous silicon through an oxidation process; and removing the silicon nitride layer.

2. The method of claim 1, wherein the etching step includes the steps of etching the silicon nitride layer with a slope or inserting an additional sidewall nitride layer process into the STI process to form a space smaller than the moat pattern.

3. The method of claim 1, wherein the ion implanting process is iteratively performed using different ion implant conditions to thereby form the isolation region having a stepwise ion concentration.

4. The method of claim 1, wherein the ion implanting process is performed with N-type material.

5. The method of claim 1, wherein the ion implanting process is performed with P-type material.

6. The method of claim 1, wherein a porosity and a thickness of the porous silicon is controlled by adjusting a reaction time in anodic oxidation.

7. The method of claim 1, wherein a porosity and a thickness of the porous silicon is controlled by adjusting a current density in anodic oxidation.

8. The method of claim 1, wherein a porosity and a thickness of the porous silicon is controlled by adjusting hydrofluoric (HF) concentration in anodic oxidation.

* * * * *